United States Patent [19]
Lin

[11] Patent Number: 6,081,318
[45] Date of Patent: Jun. 27, 2000

[54] INSTALLATION FOR FABRICATING DOUBLE-SIDED PHOTOMASK

[75] Inventor: Benjamin Szu-Min Lin, Chiayi, Taiwan

[73] Assignee: United Microelectronics Corp., Hsinchu, Taiwan

[21] Appl. No.: 09/145,750

[22] Filed: Sep. 2, 1998

[30] Foreign Application Priority Data

Jun. 25, 1998 [TW] Taiwan ................................. 87110296

[51] Int. Cl.[7] .............................. G03B 27/42; G21K 5/10; G03F 9/00
[52] U.S. Cl. ............................. 355/53; 250/492.22; 430/5
[58] Field of Search ................... 355/26, 53; 250/492.1, 250/492.2, 492.22, 492.23, 396 ML, 494.1; 430/5, 20, 22

[56] References Cited

U.S. PATENT DOCUMENTS

| | | | |
|---|---|---|---|
| 5,272,502 | 12/1993 | Saiki | 355/26 |
| 5,633,507 | 5/1997 | Pfeiffer et al. | 250/492.22 |
| 5,760,410 | 6/1998 | Matsuki et al. | 250/492.22 |
| 5,847,401 | 12/1998 | McKeown et al. | 250/396 ML |

*Primary Examiner*—Safet Metjahic
*Assistant Examiner*—Hung Henry Nguyen
*Attorney, Agent, or Firm*—Thomas, Kayden, Horstemeyer & Risley

[57] ABSTRACT

An installation for forming a double-sided photomask includes a first and a second particle sources and a first and a second focusing assemblies positioned on each side of a mechanical stage. The mechanical stage is used for holding a masking plate that requires pattern inscription. The particles generated by the first and the second particle sources are channeled to the first and second focusing assemblies, respectively. Within each focusing assembly, the particle beam is focused to a desired resolution for inscribing a pattern onto each face of the masking plate, thereby forming a double-sided photomask. The installation further includes a controlling unit coupled to the particle sources, the focusing assemblies and the mechanical stage for controlling system operation. In addition, there is a photomask pattern generator coupled to the controlling unit for supplying pattern data to the controlling unit.

16 Claims, 3 Drawing Sheets

INSTALLATION FOR FABRICATING DOUBLE-SIDED PHOTOMASK

CROSS-REFERENCE TO RELATED APPLICATION

This application claims the priority benefit of Taiwan application serial no. 87110296, filed Jun. 25, 1998, the full disclosure of which is incorporated herein by reference.

BACKGROUND OF THE INVENTION

1. Field of Invention

The present invention relates to an installation for fabricating a photomask. More particularly, the present invention relates to an installation that can concurrently produce separate patterns, one on each side of a photomask.

2. Description of Related Art

Photolithography is one of the major techniques used for transferring electric circuit patterns onto a wafer. FIG. 1A is a cross-sectional view showing a single-sided photomask and the process of transferring a pattern onto a wafer. As shown in FIG. 1A, the main body 10 of the photomask is constructed from a planar transparent substrate. The main body 10 can be made from glass or quartz, and the various patterned layers on a semiconductor wafer are obtained by coating a masking layer 12 having the required pattern over the transparent substrate 10. The masking layer 12 can be a layer of metallic chromium (Cr).

Furthermore, an anti-reflection coating 14 is often coated on top of the masking layer 12 to lower the amount of reflection during light exposure. By illuminating a photoresist layer on top of a semiconductor substrate 16 through a photomask, the pattern on the photomask is transferred to the photoresist layer. After the photoresist layer is chemically developed, a patterned photoresist layer 18 is formed over the substrate 16. As the level of integration for integrated circuit devices increases, the dimensions of a device and its line width gradually shrink.

Consequently, dimensions of pattern formed in a photomask must be carefully controlled to fall within much narrower limits in order to have a high processing yield. Since pattern dimensions on a photomask must be precisely controlled, the level of difficulty in producing a high-quality mask as well as the extent of limitations increases considerably.

FIG. 1B is a cross-sectional view showing a double-sided photomask and the process of transferring a pattern to a wafer. As shown in FIG. 1B, a required pattern on a wafer 26 is alternately extracted and placed on respective faces of a transparent substrate 20. By spreading out the density of pattern on a photomask, the level of difficulty and the number of limitations in the production of photomask are correspondingly reduced. Moreover, critical dimensions can be more precisely controlled, thereby increasing the resolution of photolithographic operation. The main body 20 of this double-sided photomask has two patterns on respective surfaces 22a and 22b.

However, through proper illumination, patterns on these two surfaces can be combined to form the necessary pattern for forming a device pattern on the photoresist layer 28. Similarly, it is common for a double-sided mask to have anti-reflection coatings 24a and 24b coated on top of the patterned layers 22a and 22b, respectively.

Since a double-sided photomask has the advantage of lowering pattern density compared with a singled-sided mask, a photoresist layer can be patterned more accurately.

In light of the foregoing, there is a need to provide an installation that can produce double-sided photomask quickly and efficiently.

SUMMARY OF THE INVENTION

Accordingly, the present invention is to provide an installation for forming a double-sided photomask capable of concurrently fabricating patterns on each side of the photomask.

To achieve these and other advantages and in accordance with the purpose of the invention, as embodied and broadly described herein, the invention provides an installation for fabricating a double-sided photomask. The installation comprises two identical photomask pattern-inscribing units capable of concurrently making patterns on each side of a photomask. The pattern-inscribing units are positioned on each side of a mechanical stage so that each unit can operate independently but in parallel to inscribe the required mask patterns onto masking layers.

The pattern-inscribing unit includes a particle source and a focusing assembly. The particle source is an electron beam. The focusing assembly includes at least a set of lenses for focusing, magnifying or shrinking the electron beam, a blanking device for allowing the electron beam to pass through or blocking the electron beam, various types of apertures for restricting the electron beam as well as to shape the electron beam, and a beam deflection unit for deflecting the electron beam to a pre-defined location. Hence, through the simultaneous operation of the two pattern-inscribing units, patterns are transferred to the anti-reflection layer and the masking layer on each side of a masking plate, thus forming a double-sided photomask.

Furthermore, the installation also includes a controlling unit coupled to the particle source, the focusing assemblies and the mechanical stage. First, patterning data is generated in a photomask pattern generator. Then, the data is fed to the controlling unit, which controls the actual operation of the two pattern-inscribing units and the mechanical stage.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
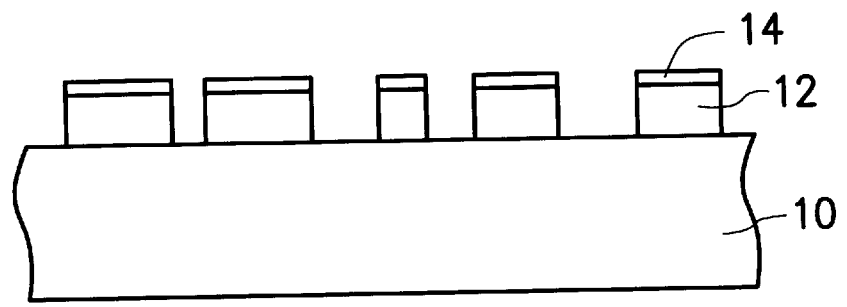
FIG. 1A is a cross-sectional view showing a single-sided photomask and the process of transferring a pattern to a wafer.
Figure 1A:
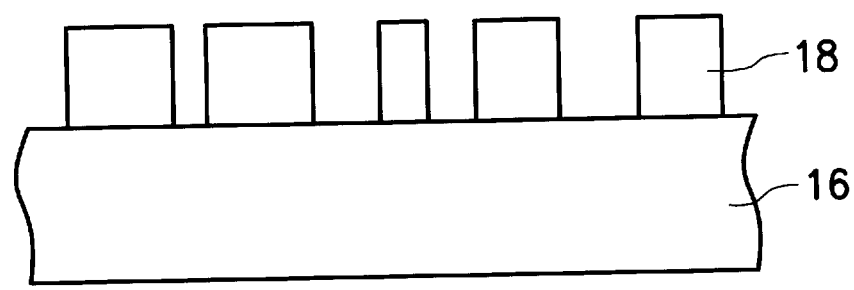
Figure 1B:
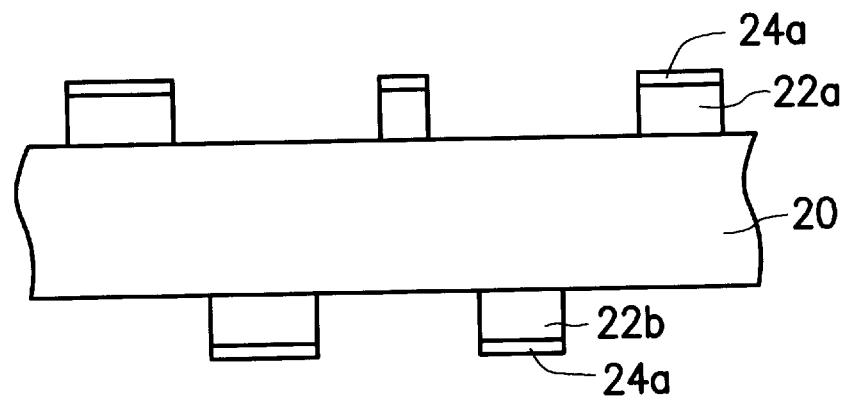
FIG. 1B is a cross-sectional view showing a double-sided photomask and the process of transferring a pattern to a wafer.
Figure 1B:
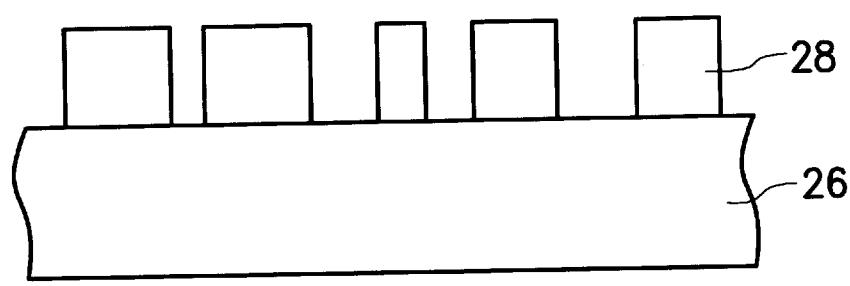

Reference will now be made in detail to the present preferred embodiments of the invention, examples of which are illustrated in the accompanying drawings. Wherever possible, the same reference numbers are used in the drawings and the description to refer to the same or like parts.

This invention provides an installation for fabricating a double-sided photomask. In this invention, two sets of pattern-inscribing units are positioned on each side of a mechanical stage. Through simultaneous activation of the two pattern-inscribing units, patterns are transferred to the masking layer on each side of a photomask. Therefore, this installation is capable of increasing mask production and lowering cost.

Figure 2:
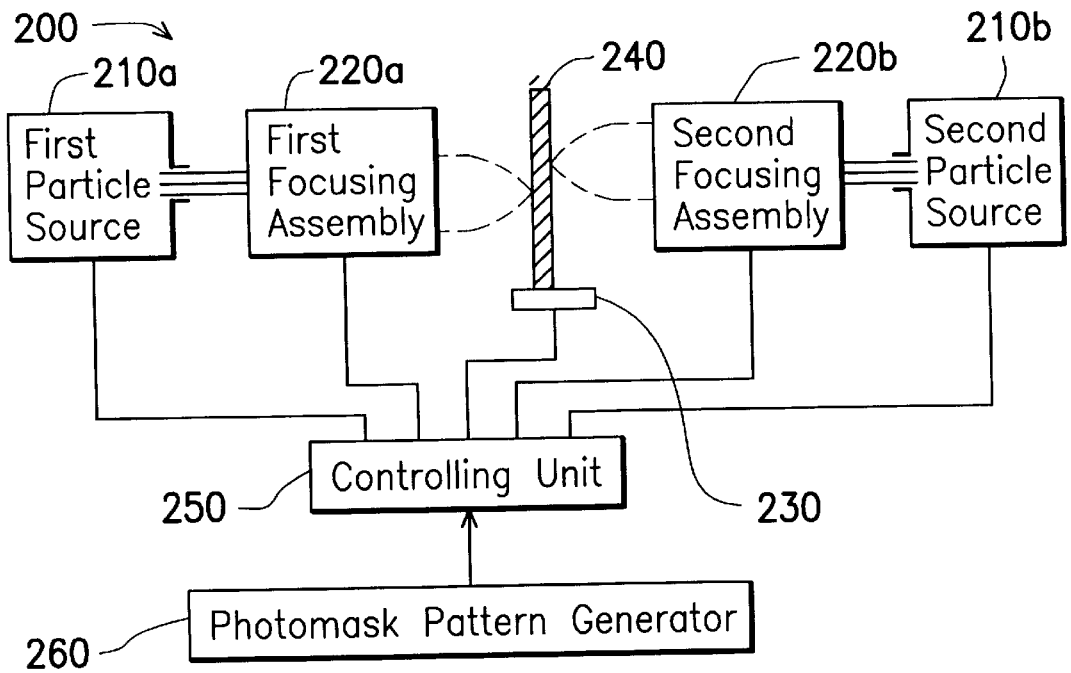
FIG. 2 is a schematic layout of the installation for fabricating double-sided photomask according to this invention.

FIG. 2 is a schematic layout of the installation for fabricating a double-sided photomask according to this invention.

A double-sided photomask production system 200 comprises a first particle source 210a, a second particle source 210b, a first focusing assembly 220a, a second focusing assembly 220b and a mechanical stage 230. In addition, the system 200 also includes a control system 250 and a photomask pattern generator 260.

The mechanical stage 230 is used for mounting a masking plate 240, and then moving the substrate 240 to a pre-determined location. The mechanical stage 230 holds the masking plate 240 from the edge and is controlled by the controlling system 250, so as to freely move the masking plate 240, for example, in vertical and horizontal directions, and rotate the plane angle of the masking plate 240 relative to fly directions of the particle sources 210a, 210b.

The aforementioned particle sources 210a and 210b are electron beams (or E-beam) generated by an electron gun. The E-beams can be Gaussian beams or variable-shaped electron beams. The generated E-beams must have sufficient power to drive the operations necessary in a double-sided photomask production system.

Figure 3:
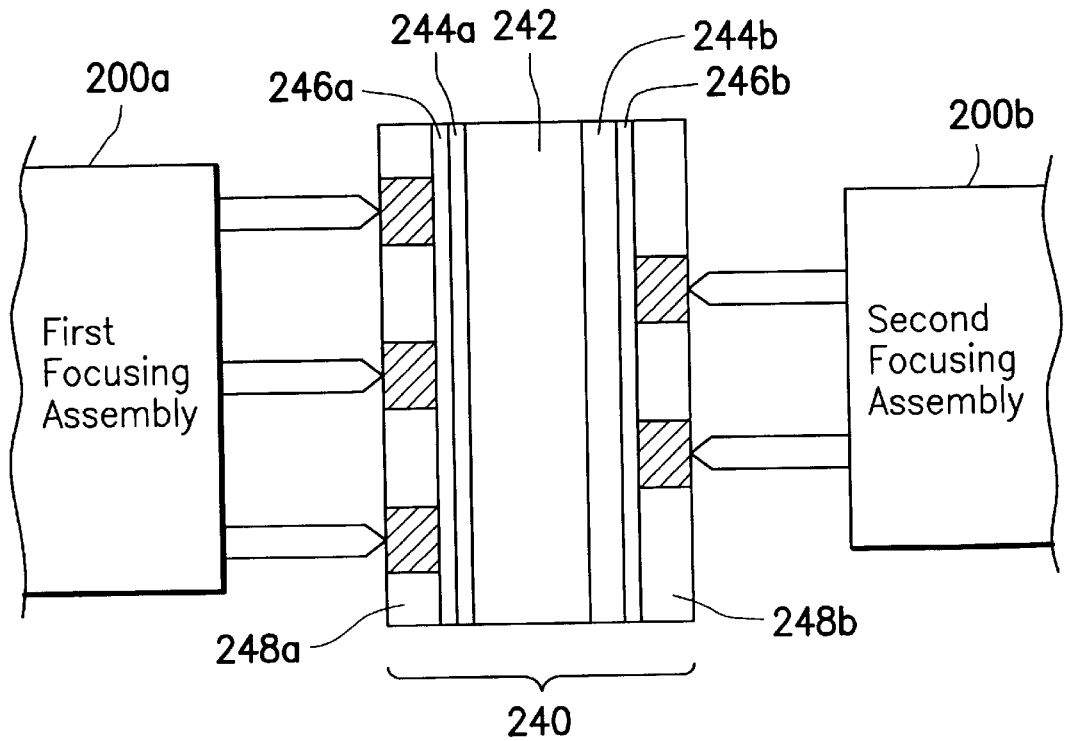
FIG. 3 is a schematic diagram showing the process of inscribing a pattern on each side of a photomask with two electron beam focusing assemblies according to this invention.

FIG. 3 is a schematic diagram showing the process of inscribing a pattern on each side of a photomask with two electron beam focusing assemblies according to this invention. As shown in FIG. 3, a first focusing device 220a and a second focusing device 220b are installed on two sides of a masking plate 240. The masking plate 240 is mounted on top of a mechanical stage (not shown). The masking plate 240 comprises a transparent substrate 242, masking layers 244a and 244b, anti-reflection layers 246a and 246b and photoresist layers 248a and 248b. The transparent substrate 242 can be made from glass or quartz, and the masking layers 244a and 244b can be made from metallic chromium (Cr).

In FIG. 3, the first focusing device 220a and the second focusing device 220b work concurrently to focus two electron beams onto the photoresist layers 248a and 248b, respectively. Hence, patterns on the photoresist layers 248a and 248b can be transferred to the anti-reflection layers 246a, 246b and the masking layers 244a, 244b, thereby forming a double-sided photomask.

The aforementioned first and second focusing devices 220a and 220b at least include various types of lenses for focusing, magnifying or shrinking the electron beam, a blanking device allowing electron beam to pass through or blocking the electron beam, various types of apertures for restricting the size and shape of the electron beam, and an electron beam deflector system for aiming an electron beam onto a pre-determined location.

Figure 4:
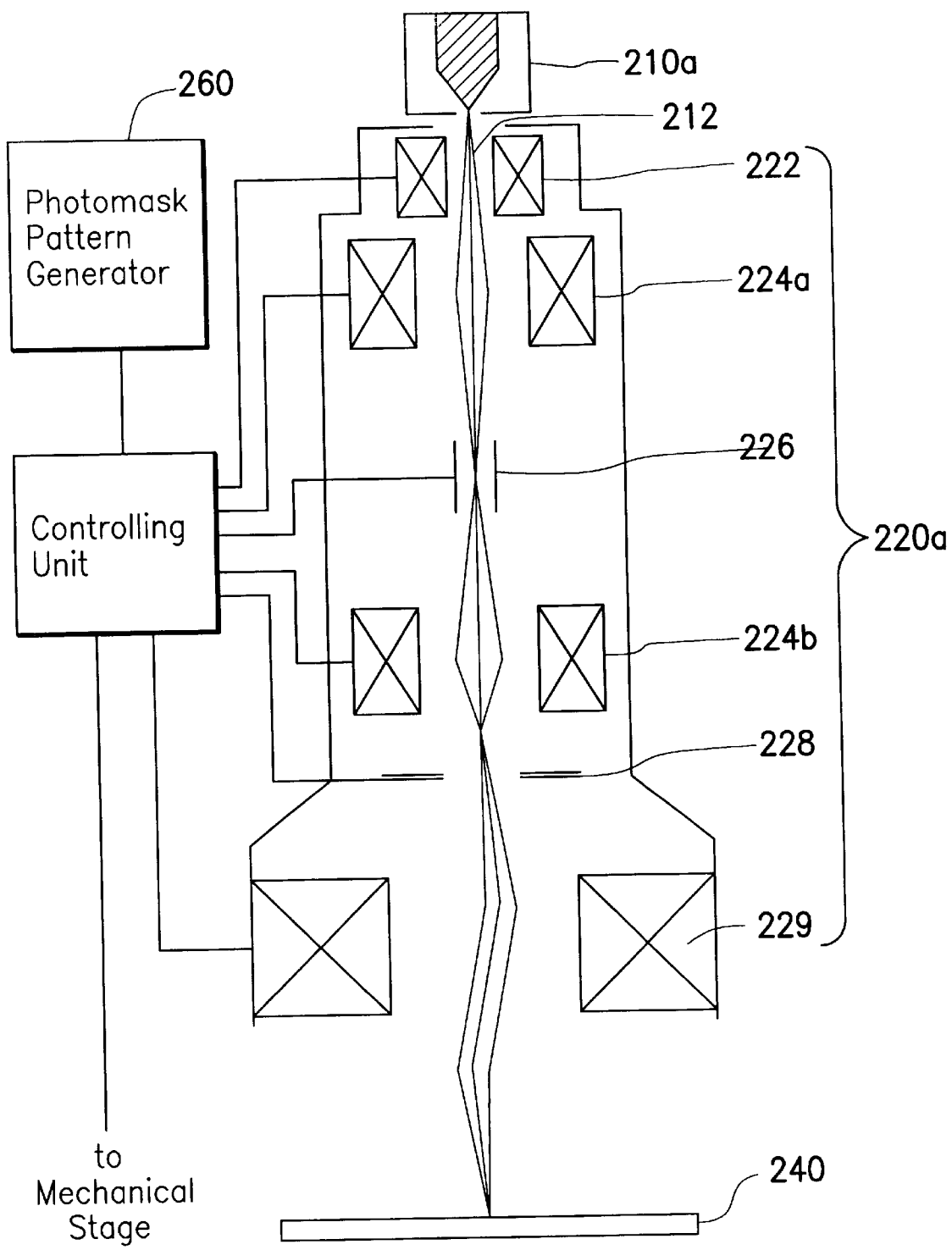
FIG. 4 is a cross-sectional view showing the focusing assembly for fabricating a double-sided photomask according to this invention.

FIG. 4 is a cross-sectional view showing one of the focusing assemblies 220a or 220b for fabricating a double-sided photomask according to this invention. After an electron beam 212 is emitted from a particle source 210a, the electron beam 212 is focused by a focusing assembly 220a. In this example, the focusing assembly 220a comprises an alignment device 222, a first condenser 224a, a blanking plate 226, a second condenser 224b, a limiting aperture 228, and an electron beam deflector system 229. The configuration as shown in FIG. 4 only serves as an example to illustrate the basic operations of the system, and therefore should not be construed as a limitation of this invention.

On entering the focusing assembly 220a, the electron beam 212 is aligned and collimated by the alignment device 222. The alignment device 222 is constructed from a current carrier coil, wherein the magnetic field generated by the coil is used as a means to control the electron beam 212. Thereafter, the electron beam 212 is focused and amplified by the first condenser 224a before going into the blanking plate 226. In the blanking plate region 226, the electron beam 212 can be switched between a state of allowing the beam to pass through or of blocking the beam.

The electron beam 212 is subsequently allowed to pass into the second condenser 224b, wherein the electron beam 212 is again focused and amplified. The first condenser 224a and the second condenser 224b are also constructed from current carrier coil, and the magnetic field produced by the coils is used to control the electron beam. Next, the electron beam 212 passes through a limiting aperture 228 in which the size and shape of the electron beam 212 is fine-tuned.

Finally, the electron beam passes through an electron beam deflecting system 229. Through the action of the deflecting system 229, the electron beam is allowed to bombard the photoresist layer on the masking plate. Hence, the pattern on the photoresist layer can be transferred to the anti-reflection layer 246a and the masking layer 244a of a photomask. The deflection system 229 is also constructed from current carrier coil.

The alignment device 222, the condensers 224a and 224b, the deflecting system 229, the blanking plate 226 and the limiting aperture 228 as shown in FIG. 4 are all coupled to a controlling unit 250. The controlling unit 250 is in turn coupled to a photomask pattern generator 260. The photomask pattern generator 260 generates the necessary pattern data, and then feeds the data into the controlling unit 250. The controlling unit 250 then supplies the necessary electrical signals to various devices within the focusing assembly 220a, thereby controlling all the relevant parameters. The controlling unit 250 also control the mechanical stage 230 to move the masking plate 240 to a pre-determined position by a combined movement along vertical, horizontal and rotating directions. Consequently, a proper pattern is transferred to the masking plate.

Since there are two sets of assemblies 210a, 220a and 210b, 220b working concurrently, this invention is capable of generating a pattern on each side of the mask and resulting in the formation of a double-sided photomask. Hence, efficiency of mask production can be increased while cost of production can be lowered.

In addition, the entire system can use just one particle source if a beam splitter is incorporated so that one electron beam is split into two beams. The split electron beams are then channeled into the first focusing assembly and the second focusing assembly, respectively. Finally, the separated beams are focused, magnified or deflected, just like a two-beam system, before being delivered to pre-destined locations on each side of a photomask. The above beam splitter can also be constructed from a plurality of current carrier coils. The current carrier coils are used to separate out and channel the electrons emitted from the single particle source.

In summary, by installing two sets of pattern-inscribing units, one on each side of a masking plate, this invention is capable of concurrently forming patterns on each side of the masking plate. Consequently, the time required for forming a double-sided photomask is shortened, and hence production efficiency is increased and production cost is lowered.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An installation for forming a double-sided photomask for of producing patterns on two sides of a masking plate concurrently, the installation comprising:

a first and a second particle sources for generating a first and a second electron beams supplying the installation through displacement and rotation;

a mechanical stage for holding the masking plate and then moving the masking plate to a pre-determined location;

a first and a second focusing assemblies for focusing the respective first and the second particle beams so that each can properly focus on the masking plate at intended locations for inscribing a masking pattern on first and second sides of the masking plate, wherein the first and the second focusing assemblies are installed on each side of the mechanical stage; and a controlling unit including a programmable control means to control performances of the particle sources, the focusing assemblies, and the mechanical stage by simply controlling a plurality of control parameters.

2. The installation of claim 1, wherein the installation further includes a photomask pattern generator for supplying pattern data to the controlling unit, in which the pattern data are used by the controlling unit for controlling the particle sources, the focusing assemblies, and the mechanical stage, so as to produce the intended masking pattern.

3. The installation of claim 1, wherein the first and the second electron beams are Gaussian electron beams.

4. The installation of claim 1, wherein the first and the second electron beams are variable shaped electron beams.

5. The installation of claim 1, wherein each first or the second focusing assembly further includes:

a plurality of lenses for focusing, magnifying and shrinking incoming electron beams from the first or the second particle source;

a blanking device, which either allows particles from the first or the second particle source to pass through or blocks the passage of the particles;

a plurality of apertures for restricting the size of the first or the second particle beam, and forming a first or a second particle beam having the correct shape; and an electron beam deflecting system for deflecting the first or the second particle beam to pre-determined locations.

6. The installation of claim 5, wherein the lenses and the electron beam deflector system are constructed using a plurality of current carrier coils.

7. An installation for forming a double-sided photomask for use in semiconductor fabrication to concurrently produce patterns on first and second faces of a masking plate, the installation comprising:

a mechanical stage for holding the masking plate and then moving the masking plate to a pre-determined location through displacement and rotation;

a particle source for generating a primary particle beam supplying the installation;

a beam splitter capable of receiving the primary particle beam and splitting the primary particle beam into a first particle beam and a second particle beam;

a first and a second focusing assemblies for respectively receiving the first and the second particle beams produced by the beam splitter and then focusing the first and the second particle beams to the masking plate for inscribing patterns onto the first and the second faces of the masking plate respectively, wherein the first and the second focusing assemblies are installed on each side of the mechanical stage; and a controlling unit including a programmable control means to control performances of the particle sources, the focusing assemblies, and the mechanical stage by simply controlling a plurality of control parameters.

8. The installation of claim 7, wherein the installation further includes a photomask pattern generator for supplying pattern data to the controlling unit, in which the pattern data are used by the controlling unit for controlling the particle sources, the focusing assemblies, and the mechanical stage, so as to produce the intended patterns.

9. The installation of claim 7, wherein the particle source generates a high-energy electron beam.

10. The installation of claim 7, wherein the high-energy particle beam includes a Gaussian electron beam.

11. The installation of claim 7, wherein the high-energy particle beam includes a variable-shaped electron beam.

12. The installation of claim 7, wherein the beam splitter is constructed using a plurality of current carrier coils.

13. The installation of claim 7, wherein each first or second focusing assembly further includes:

a plurality of lenses for focusing, magnifying and shrinking incoming beams from the particle source;

a blanking device, which either allows particles from the particle source to pass through or blocks the passage of the particles;

a plurality of apertures for restricting the size of the particle beam, and forming a particle beam having the correct shape; and an electron beam deflecting system for deflecting the particle beam to a predetermined location.

14. The installation of claim 13, wherein the lenses and the electron beam deflector system are constructed using a plurality of current carrier coils.

15. An installation for forming a double-sided photomask suitable use of producing patterns on two sides of a masking plate concurrently, the installation comprising:

a first and a second particle sources for generating a first and a second electron beams supplying the installation through displacement and rotation;

a mechanical stage for holding the masking plate and then moving the masking plate to a pre-determined location;

a first and a second focusing assemblies for focusing the respective first and the second particle beams so that each can properly focus on the masking plate at intended locations for inscribing a masking pattern on first and second sides of the masking plate, wherein the first and the second focusing assemblies are installed on each side of the mechanical stage; and a controlling unit with couplings to control performances of the particle sources, the focusing assemblies, and the mechanical stage, so that the controlling unit can accordingly control performances of the particles source, the focusing assemblies, and the mechanical stage, wherein the control unit comprises a programmable control means to perform its control functions by simply controlling a plurality of control parameters.

16. The installation of claim 15, wherein the installation further comprises a primary particle source and a beam splitter, in which the beam splitter receives the primary particle source and splits the primary particle source into the first particle source and the second particle source.

* * * * *